(12) United States Patent
Yamamoto et al.

(10) Patent No.: US 10,941,483 B2
(45) Date of Patent: Mar. 9, 2021

(54) IN-LINE COATING DEVICE, IN-LINE COATING METHOD, AND SEPARATOR

(71) Applicant: NISSAN MOTOR CO., LTD., Yokohama (JP)

(72) Inventors: Keisuke Yamamoto, Chigasaki (JP);
Satoru Moriya, Yokohama (JP);
Toshihide Asano, Yokohama (JP);
Tsuyoshi Sugimoto, Yokohama (JP);
Motoki Yaginuma, Yokohama (JP);
Yasuhiro Numao, Yokosuka (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 360 days.

(21) Appl. No.: 14/432,645

(22) PCT Filed: Sep. 30, 2013

(86) PCT No.: PCT/JP2013/076570
§ 371 (c)(1),
(2) Date: Mar. 31, 2015

(87) PCT Pub. No.: WO2014/054587
PCT Pub. Date: Apr. 10, 2014

(65) Prior Publication Data
US 2015/0240346 A1    Aug. 27, 2015

(30) Foreign Application Priority Data

Oct. 1, 2012  (JP) ................................. 2012-219459
Jul. 4, 2013  (JP) ................................. 2013-140834

(51) Int. Cl.
*C23C 14/32*    (2006.01)
*C23C 14/56*    (2006.01)
(Continued)

(52) U.S. Cl.
CPC ............ *C23C 14/32* (2013.01); *C23C 14/345* (2013.01); *C23C 14/3464* (2013.01);
(Continued)

(58) Field of Classification Search
CPC ... C23C 14/32; C23C 14/345; C23C 14/3464; C23C 14/568; Y02E 60/50; Y02P 70/56;
(Continued)

(56) References Cited

U.S. PATENT DOCUMENTS 4,261,808 A * 4/1981 Walter ................. C23C 14/568
204/298.25
5,846,328 A * 12/1998 Aruga .................. C23C 14/568
118/718

(Continued)

FOREIGN PATENT DOCUMENTS

CA    2864844 A1    8/2013
EP    2604717       6/2013
(Continued)

*Primary Examiner* — Cynthia H Kelly
*Assistant Examiner* — Aaron J Greso
(74) *Attorney, Agent, or Firm* — Faegre Drinker Riddle & Reath LLP

(57) ABSTRACT

An in-line coating device includes: a coating section configured to perform coating on a workpiece; and a transport section configured to transport a plurality of the workpieces in the coating section. The coating section is provided with a plurality of coating materials which are aligned. The transport section transports the workpieces such that the workpieces face the plurality of coating materials. The in-line coating device includes a voltage applying section configured to, when the workpiece is transported and faces each coating material, apply to the workpiece, a bias voltage to attract particles emitted from the coating material toward the workpiece. The bias voltages applied to the workpiece by the voltage applying section when the workpiece faces
(Continued)

one of the coating materials can be different from that applied when the workpiece faces another one of the coating material.

8 Claims, 11 Drawing Sheets

(51) Int. Cl.
    *C23C 14/34*     (2006.01)
    *H01M 8/0228*     (2016.01)
    *H01M 8/0245*     (2016.01)

(52) U.S. Cl.
    CPC ......... *C23C 14/568* (2013.01); *H01M 8/0228* (2013.01); *H01M 8/0245* (2013.01); *Y02P 70/50* (2015.11)

(58) Field of Classification Search
    CPC ....... Y02P 70/50; H01M 8/02; H01M 8/0228; H01M 8/0245
    See application file for complete search history.

(56) References Cited

U.S. PATENT DOCUMENTS

| | | | |
|---|---|---|---|
| 6,886,244 B1 | 5/2005 | McLeod et al. | |
| 2003/0129407 A1* | 7/2003 | Teer | C23C 14/0605 428/408 |
| 2004/0069614 A1* | 4/2004 | McLeod | C23C 14/345 204/192.12 |
| 2008/0085439 A1* | 4/2008 | Hilliard | H01M 8/1286 429/495 |
| 2008/0107928 A1* | 5/2008 | Kikui | C23C 14/022 429/492 |
| 2011/0229800 A1* | 9/2011 | Jeon | H01M 8/0206 429/516 |
| 2011/0250357 A1 | 10/2011 | Willers | |
| 2011/0305912 A1* | 12/2011 | Teer | C23C 14/35 428/457 |
| 2013/0209917 A1 | 8/2013 | Himeno et al. | |

FOREIGN PATENT DOCUMENTS

| | | |
|---|---|---|
| JP | S63-89660 A | 4/1988 |
| JP | H07-334843 A | 12/1995 |
| JP | 2002-008226 A | 1/2002 |
| JP | 2004-197117 A | 7/2004 |
| JP | 2005-190968 A | 7/2005 |
| JP | 2009-187758 A | 8/2009 |
| JP | 2010-272490 A | 12/2010 |
| JP | 2012-514861 A | 6/2012 |
| WO | WO 2012/008534 A1 | 1/2012 |
| WO | WO 2013/124690 * | 8/2013 ............ C23C 14/06 |

* cited by examiner

IN-LINE COATING DEVICE, IN-LINE COATING METHOD, AND SEPARATOR

TECHNICAL FIELD

The present invention relates to an in-line coating device, an in-line coating method, and a separator.

BACKGROUND ART

In coating methods such as sputtering and ion-plating, it is known that the properties of the coating layer formed on the surface of a workpiece can be controlled by adjusting bias voltage applied to the workpiece.

In the invention according to Patent Literature 1, for example, the inventors properly adjust the bias voltage to form a coating layer excellent in conduction and corrosion resistance on the surface of a fuel-cell separator.

CITATION LIST

Patent Literature

Patent Literature 1: Japanese Patent Application Publication No. 2010-272490

SUMMARY OF INVENTION

Technical Problem

Coating of workpieces with the bias voltage adjusted may be carried out in a batch system, but the inventors particularly examined in-line systems to improve the mass production.

The invention was made as a result of the examination, and an object of the present invention is to provide an in-line coating device and an in-line coating method which are excellent in mass production and are capable of applying an appropriate bias voltage to workpieces.

Solution to Problem

An in-line coating device to achieve the aforementioned object includes: a coating section configured to perform coating on a workpiece; and a transport section configured to transport a plurality of the workpieces in the coating section. The coating section is provided with a plurality of coating materials which are aligned. The transport section transports the workpieces such that the workpieces face the plurality of coating materials. The in-line coating device includes a voltage applying section configured to, when the workpiece is transported and faces each coating material, apply to the workpiece, a bias voltage to attract particles emitted from the coating material toward the workpiece. The bias voltages applied to the workpiece by the voltage applying section when the workpiece faces one of the coating materials can be different from that applied when the workpiece faces another one of the coating material.

An in-line coating method to achieve the aforementioned object includes a coating step of transporting a plurality of workpieces such that the workpieces face a plurality of coating materials which are aligned while applying a bias voltage to the workpiece to attract particles emitted from each coating material toward the workpiece for coating when the workpiece faces the coating material. In the coating step, the bias voltage applied when the workpiece faces one of the coating materials is different from the bias voltage applied when the workpiece faces another one of the coating materials.

A separator to achieve the aforementioned object includes: a thin plate-shaped base material having a rectangular shape; and a coating layer formed on the base material. One end face constituting a side of a periphery of the rectangular shape has a different characteristic from that of end faces constituting the other sides thereof.

Advantageous Effects of Invention

The in-line coating device and method having the aforementioned configurations continuously perform coating on the plurality of workpieces by transporting the plurality of workpieces such that the workpieces face the plural coating materials and therefore provide excellent mass production. Moreover, the in-line coating device and method having the aforementioned configurations can apply different bias voltages to each workpiece when the workpiece faces different coating materials. It is therefore possible to apply appropriate bias voltages corresponding to the coating materials.

The separator having the aforementioned configuration is formed by transporting the plural thin plate-shaped base materials as the workpieces with the ends hooked on the linear member for coating such that the base materials are hung and arranged in the longitudinal direction of the linear member and removing the ends of the base materials hooked on the linear member. According to the thus-formed separator, the linear member constituting the transport unit is covered with the ends of the base materials as the workpieces. This can prevent the coating materials from adhering to the linear member, reducing the trouble of maintenance. Accordingly, the mass production thereof is excellent. Moreover, since the ends of the base materials are hooked on the linear member, it is possible to apply appropriate bias voltages corresponding to the respective coating materials to the transported base materials through the ends of the based materials.

DESCRIPTION OF EMBODIMENTS

Hereinafter, embodiments of the present invention are described with reference to the drawings attached. The dimensional proportions of the drawings are exaggerated for the convenience of description and are different from real ones.

First Embodiment

Figure 1:
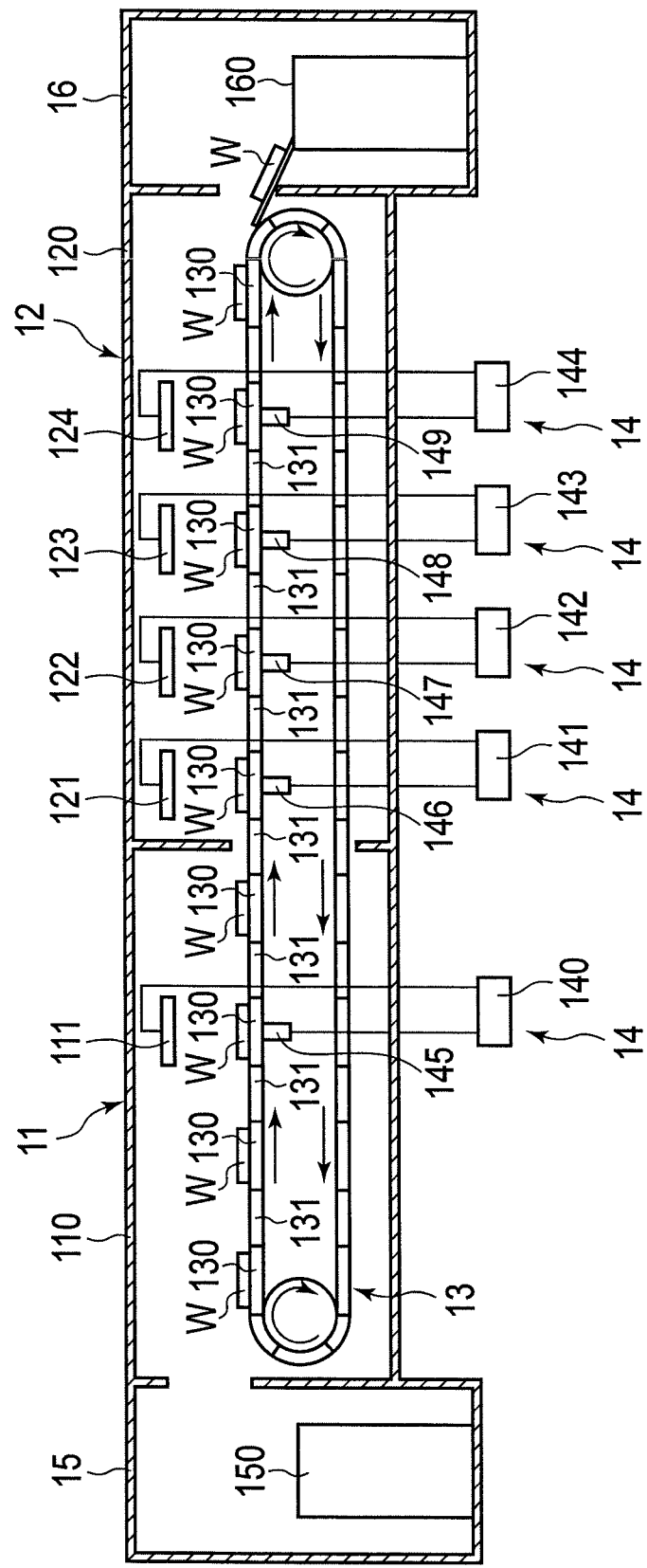
FIG. 1 is a side view illustrating a schematic configuration of an in-line coating device of a first embodiment.

As illustrated in FIG. 1, an in-line coating device 10 of a first embodiment includes a belt conveyor 13 (transport section) capable of conveying plural workpieces W. The in-line coating device 10 includes: an oxide film removing section 11 in which oxide film on the surface of each workpiece W is removed by bombardment; and a coating section 12 in which each workpiece W is coated. The in-line coating device 10 includes a voltage applying section 14 configured to apply bias voltage to each workpiece W at the processes of bombardment and coating.

Each workpiece W is a thin plate-shaped metallic base material. The workpieces W are subjected to coating and other processing to be formed into separators used in a fuel cell.

The belt conveyor 13 includes: plural conducting portions 130 provided along the transport direction of the workpieces W so as to be spaced from one another; and insulating portions 131 provided between the conducting portions 130. The conducting portions 130 and insulating portions 131 constitute a belt of the belt conveyor 13.

The conducting portions 130 are made of metal, for example. The insulating portions 131 are made of resin, for example. The belt conveyor 13 transports the workpieces W placed on the respective conducting portions 130. The workpieces W are in contact with the conducting portions 130 for electric connection therebetween.

The oxide film removing section 11 includes: a chamber 110 in which a part of the belt conveyor 13 is placed; and an electrode 111 arranged facing each workpiece W. The chamber 110 communicates with a vacuum pump configured to exhaust the chamber 110 and a noble gas introducing portion configured to introduce noble gas into the chamber 110. The oxide film removing section 11 is provided upstream of the coating section 12 in the transport direction of the workpieces W.

The coating section 12 includes a chamber 120 in which a part of the belt conveyor 13 is placed. The chamber 120 communicates with a vacuum pump configured to exhaust the chamber 120 and a noble gas introducing portion configured to introduce noble gas into the chamber 120. The chambers 110 and 120 are formed by partitioning a chamber capable of accommodating the entire belt conveyor 13. The noble gas introduced to the oxide film removing section 11 and coating section 12 is heavy inert gas such as argon, for example.

The coating section 12 is provided with four targets 121, 122, 123, and 124 (coating materials) placed along the transport direction of the workpieces W so as to face the individual workpieces W. The number of targets is not limited to four. The targets 121 and 122 are made of chrome, for example, and the targets 123 and 124 are made of carbon, for example. The materials constituting the targets are not limited to these materials.

A load lock chamber 15 accommodating the workpieces W is provided next to the chamber 110 upstream in the transport direction of the workpieces W. The plural workpieces W are accommodated in a box 150 provided within the load lock chamber 15. In the load lock chamber 15, an industrial robot takes the workpieces W out of the box 150 and places the same on the respective conducting portions 130 of the belt conveyor 13, for example. The load lock chamber 15 communicates with a vacuum pump configured to exhaust the load lock chamber 15.

A load lock chamber 16 accommodating the workpieces W is provided next to the chamber 120 downstream in the transport direction of the workpieces W. The coated workpieces W are transported by the belt conveyor 13 and are accommodated in a box 160 provided within the load lock chamber 16. The load lock chamber 16 communicates with a vacuum pump configured to exhaust the load lock chamber 16.

A voltage applying section 14 includes power supplies 140, 141, 142, 143, and 144 which are configured to generate bias voltages. The bias voltages generated by the power supplies 140 to 144 are different from one another.

The voltage applying section 14 includes a brush 145 which comes into sliding contact with the belt of the belt conveyor 13 at the position opposite to the electrode 111. The power supply 140 and brush 145 are electrically connected. The power supply 140 and electrode 111 are electrically connected.

The voltage applying section 14 includes a brush 146 which comes into sliding contact with the belt of the belt conveyor 13 at the position opposite to the target 121. The power supply 141 and brush 146 are electrically connected. The power supply 141 and target 121 are electrically connected.

The voltage applying section 14 includes a brush 147 which comes into sliding contact with the belt of the belt conveyor 13 at the position opposite to the target 122. The power supply 142 and brush 147 are electrically connected. The power supply 142 and target 122 are electrically connected.

The voltage applying section 14 includes a brush 148 which comes into sliding contact with the belt of the belt conveyor 13 at the position opposite to the target 123. The power supply 143 and brush 148 are electrically connected. The power supply 143 and target 123 are electrically connected.

The voltage applying section 14 includes a brush 149 which comes into sliding contact with the belt of the belt conveyor 13 at the position opposite to the target 124. The power supply 144 and brush 149 are electrically connected. The power supply 144 and target 124 are electrically connected.

Each of the brushes 145 to 149 alternately comes into contact with the conducting portions 130 and the insulating portions 131 as the workpieces W are transported by the belt conveyor 13.

The in-line coating method of the first embodiment is described below. The in-line coating method of the first embodiment includes: an oxide film removing step of removing oxide film on the surface of each workpiece W by bombardment; and a coating step of coating the workpiece W by sputtering after the oxide film removing step.

When each conducting portion 130 moves with a workpiece W and comes into contact with the brush 145 and the workpiece W faces the electrode 111, the workpiece W is subjected to bombardment.

The workpiece W and power supply 140 are electrically connected through the conducting portion 130, and the bias voltage generated by the power supply 140 is thereby applied to the workpiece W. The bias voltage generated by the power supply 140 is larger than the bias voltages generated by the power supplies 141 to 144.

When the bias voltage generated by the power supply 140 is applied to the workpiece W, gas between the workpiece W and electrode 111 is ionized by the potential difference therebetween, and the gas ions are attracted to the surface of the workpiece W to collide with the workpiece W. The oxide film on the surface of the workpiece W is thereby removed.

The bombardment may be performed on the workpiece W when the workpiece W faces the electrode 111 and is temporarily stopped. The mass production can be improved when bombardment is performed on the workpiece W while the workpiece W is transported without being stopped.

When the conducting portion 130 moves apart from the brush 145 and the subsequent insulating portion 131 comes into contact with the brush 145, the electrical connection between the workpiece W and power supply 140 is disconnected, and the bombardment is stopped.

When the conducting portion 130 moves with the workpiece W and comes into contact with the brush 146 and the workpiece W faces the target 121, the workpiece W is subjected to coating.

When the workpiece W and power supply 141 are electrically connected through the conducting portion 130, the bias voltage generated by the power supply 141 is applied to the workpiece W. When the bias voltage generated by the power supply 141 is applied to the workpiece W, gas between the workpiece W and target 121 is ionized by the potential difference therebetween, and the gas ions are attracted by the target 121 to collide with the target 121. As a result, the material constituting the target 121 is ejected in the form of atoms or molecules. The ejected material constituting the target 121 in the form of atoms or molecules (particles emitted from the coating material) is attracted to the workpiece W to which the bias voltage is applied, so that the workpiece W is coated.

When the conducting portion 130 moves apart from the brush 146 and the subsequent insulating portion 131 comes into contact with the brush 146, the electrical connection between the workpiece W and power supply 141 is disconnected, so that the coating of the workpiece W is stopped.

When the conducting portion 130 moves with the workpiece W and comes into contact with the brush 147 and the workpiece W faces the target 122, the workpiece W is subjected to coating. When the conducting portion 130 moves apart from the brush 147, the coating is stopped.

When the conducting portion 130 moves with the workpiece W and comes into contact with the brush 148 and the workpiece W faces the target 123, the workpiece W is subjected to coating. When the conducting portion 130 moves apart from the brush 148, the coating is stopped.

When the conducting portion 130 moves with the workpiece W and comes into contact with the brush 149 and the workpiece W faces the target 124, the workpiece W is subjected to coating. When the conducting portion 130 moves apart from the brush 149, the coating is stopped.

The workpiece W may be temporarily stopped for coating each time that the workpiece W faces the target 121, 122, 123, or 124. The mass production can be improved when coating is performed while the workpiece W is transported without being stopped.

The coating layers formed on the workpiece W have different properties depending on the bias voltages of the power supplies 141 to 144. Even when the targets 121 and 122 are made of a same material, chrome, for example, the formed coating layers have different properties because of the difference between the bias voltages applied. The properties of each coating layer formed are varied because the crystalline structure of the formed coating layer depends on the bias voltage applied.

The bias voltages of the power supplies 141 to 144 are set based on the desired properties given to the respective coating layers. The bias voltage generated by the power supply 141, for example, is applied to form part of the coating layers in contact with the surface of the workpiece W. Accordingly, in order to reduce the electrical resistance between the coating layer and workpiece W, the bias voltage generated by the power supply 141 is set so that the formed coating layer has high conductivity.

The operational effects of the first embodiment are described.

In the in-line coating device 10 and in-line coating method of the first embodiment, the plural workpieces W are transported such that the plural workpieces W face the plural targets 121 to 124 for successively perform coating of the plural workpieces W. The in-line coating device 10 and in-line coating method of the first embodiment therefore provide high mass production.

In the in-line coating device 10 and in-line coating method of the first embodiment, different bias voltages can be applied to the targets 121 to 124 each time the workpiece W faces the individual targets 121 to 124. It is therefore possible to apply appropriate bias voltages to the targets 121 to 124. By applying appropriate bias voltages to the individual targets 121 to 124, coating layers having different properties are well formed.

In the in-line coating device 10 and in-line coating method of the first embodiment, the bias voltage applied to the workpiece W at the process of bombardment of each workpiece W can be different from those applied when the workpiece W faces the targets 121 to 124. It is therefore possible to apply bias voltage appropriate for bombardment. By applying the bias voltage appropriate for bombardment, the oxide film on the surface of the workpiece W is surely removed.

In the in-line coating device 10 and in-line coating method of the first embodiment, the application of bias voltages and the stop of the same are switched by electrically connecting the workpiece W and voltage applying section 14 through the conducting portion 130 and disconnecting the electrical connection between the workpiece W and voltage applying section 14 between the conducting portions 130, the connection and disconnection being implemented as the workpiece W is transported. Accordingly, the in-line coating device 10 and in-line coating method of the first embodiment can apply the bias voltages and stop the application of the bias voltages while transporting the workpiece W without stopping the same and therefore provide high mass production.

Second Embodiment

Figure 2:
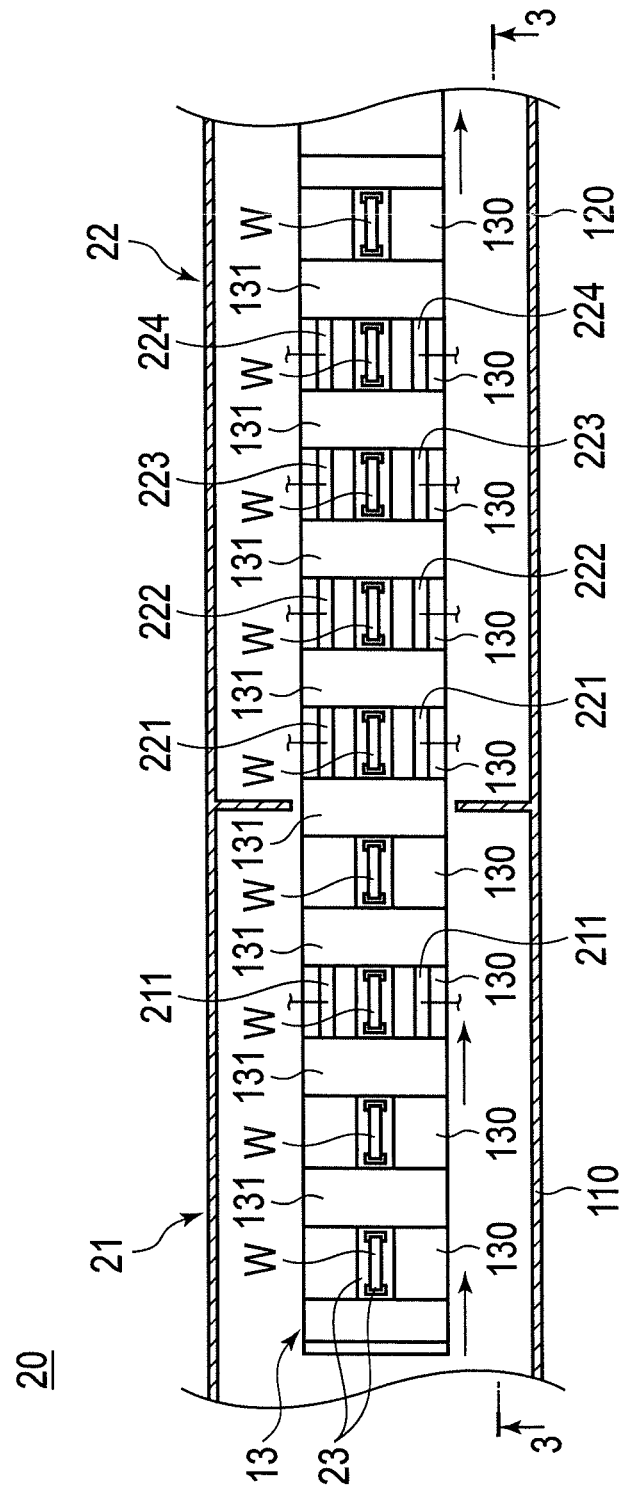
FIG. 2 is a plan view illustrating a schematic configuration of an in-line coating device of a second embodiment.
Figure 3:
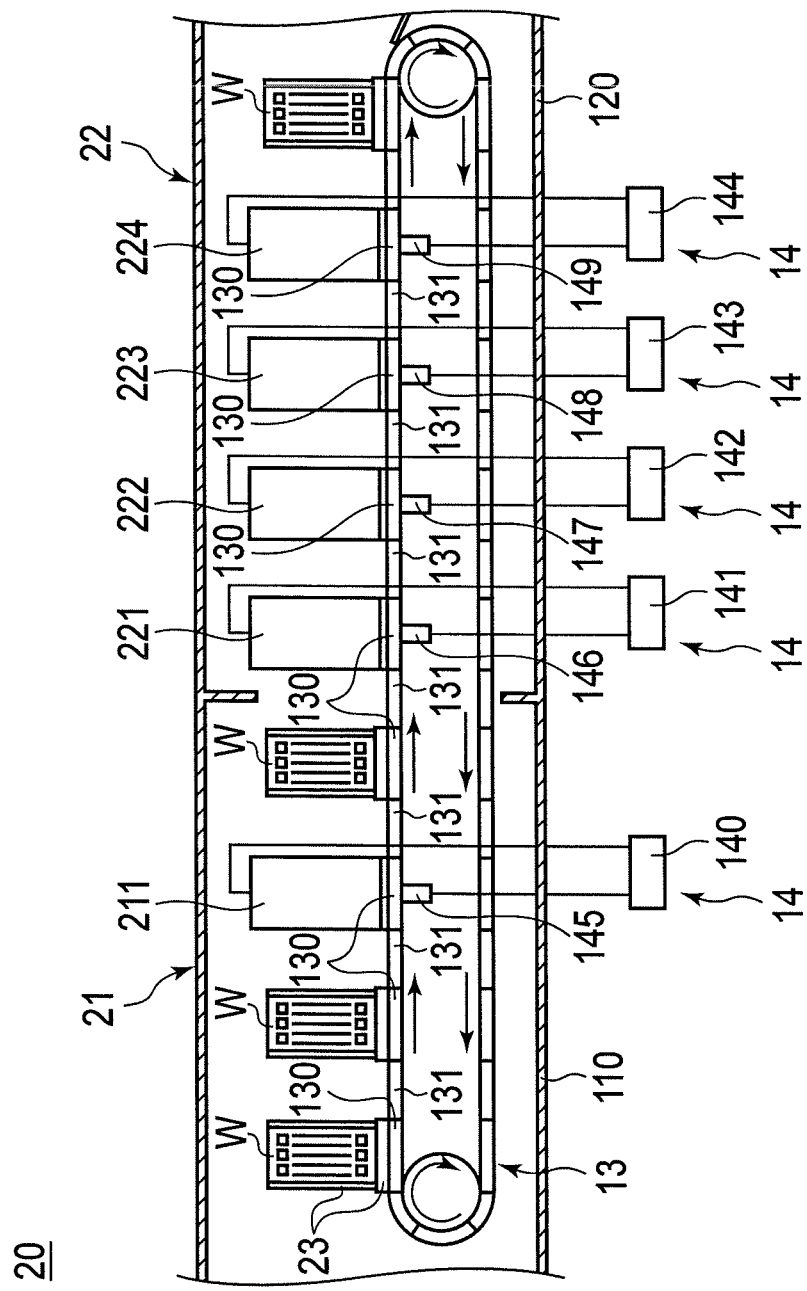
FIG. 3 is a side view along a line 3-3 of FIG. 2, illustrating a schematic configuration of the in-line coating device of the second embodiment.

As illustrated in FIGS. 2 and 3, an in-line coating device 20 of a second embodiment includes electrodes 211 and targets 221, 222, 223, and 224, which are arranged in a different manner from that of the first embodiment. Moreover, the second embodiment is different from the first embodiment in terms of the position of each workpiece W placed on the belt conveyor 13. The second embodiment is the substantially same as the first embodiment other than the above-described matters. In FIGS. 2 and 3, the same components as those of the first embodiment are given the same reference numerals, and an overlapping description is omitted.

As illustrated in FIG. 2, in an oxide film removing section 21 of the second embodiment, electrodes 211 are arranged on both sides of each workpiece W in the direction that intersects the transport direction of the workpieces W. In a coating section 22 of the second embodiment, the pairs of targets 221 to 224 are each arranged on both sides of the workpieces W in the direction that intersects the transport direction of the workpieces W. The materials constituting the targets 221 to 224 are the same as the materials constituting the targets 121 to 124 of the first embodiment, respectively.

Each workpiece W is transported, standing such that the both surfaces thereof in the thickness direction face the electrodes 211 or targets 221 to 224. Jigs 23, each of which has a frame shape and is fitted on the edge of each workpiece W, support the respective workpieces W standing on the belt conveyor 13. The jigs 23 are conductive. The jigs 23 electrically connect the respective workpieces W and conducting portions 130 of the belt conveyor 13.

When each conducting portion 130 moves together with a workpiece W and a jig 23 to come into contact with the brush 145 and the workpiece W faces the electrodes 211, bias voltage is applied to the workpiece W so that the workpiece W is bombarded. The bias voltage is applied to the workpiece W through the conducting portion 130 and jig 23.

Since the electrodes 211 face the both surfaces of the workpiece. W, the both surfaces of the workpiece W are bombarded. Thus, the oxide film on each surface of the workpiece W is removed. When the conducting portion 130 moves apart from the brush 145 and the subsequent insulating portion 131 comes into contact with the brush 145, the electrical connection between the workpiece W and power supply 140 is disconnected, and the bombardment is thereby stopped.

When the conducting portion 130 moves with the workpiece W and jig 23 to come into contact with the brush 146 and the workpiece W faces the targets 221, the workpiece W is subjected to coating. Since the targets 221 face the both surfaces of the workpiece W, the both surfaces of the workpiece W are coated. When the conducting portion 130 moves apart from the brush 146 and the subsequent insulating portion 131 comes into contact with the brush 146, the electrical connection between the workpiece W and power supply 141 is disconnected, and the coating of the workpiece W is thereby stopped.

When the conducting portion 130 moves to come into contact with the brush 147 and the workpiece W faces the targets 222, the both surfaces of the workpiece W are subjected to coating. When the conducting portion 130 moves apart from the brush 147, the coating is thereby stopped.

When the conducting portion 130 moves to come into contact with the brush 148 and the workpiece W faces the targets 223, the both surfaces of the workpiece W are subjected to coating. When the conducting portion 130 moves apart from the brush 148, the coating is thereby stopped.

When the conducting portion 130 moves to come into contact with the brush 149 and the workpiece W faces the targets 224, the both surfaces of the workpiece W are subjected to coating. When the conducting portion 130 moves apart from the brush 149, the coating is thereby stopped.

In the first embodiment, one surface of each workpiece W is coated by one transport from an end to the other end of the belt conveyor 13. On the other hand, in the second embodiment, the targets 221 to 224 are placed on both sides of each workpiece W in the direction that intersects the transport direction of the workpieces W, and this configuration allows the both surfaces of each workpiece W to be coated by one transport. Accordingly, the in-line coating device 20 and in-line coating method of the second embodiment exhibit an effect on further improving the mass production in addition to the effects of the first embodiment.

In the first embodiment, one surface of the workpiece W is bombarded by one transport. On the other hand, the both surfaces of the workpiece W are bombarded by one transport in the second embodiment. Accordingly, the in-line coating device 20 and in-line coating method of the second embodiment exhibit an effect on further improving the mass production in addition to the effects of the first embodiment.

Third Embodiment

Figure 4:
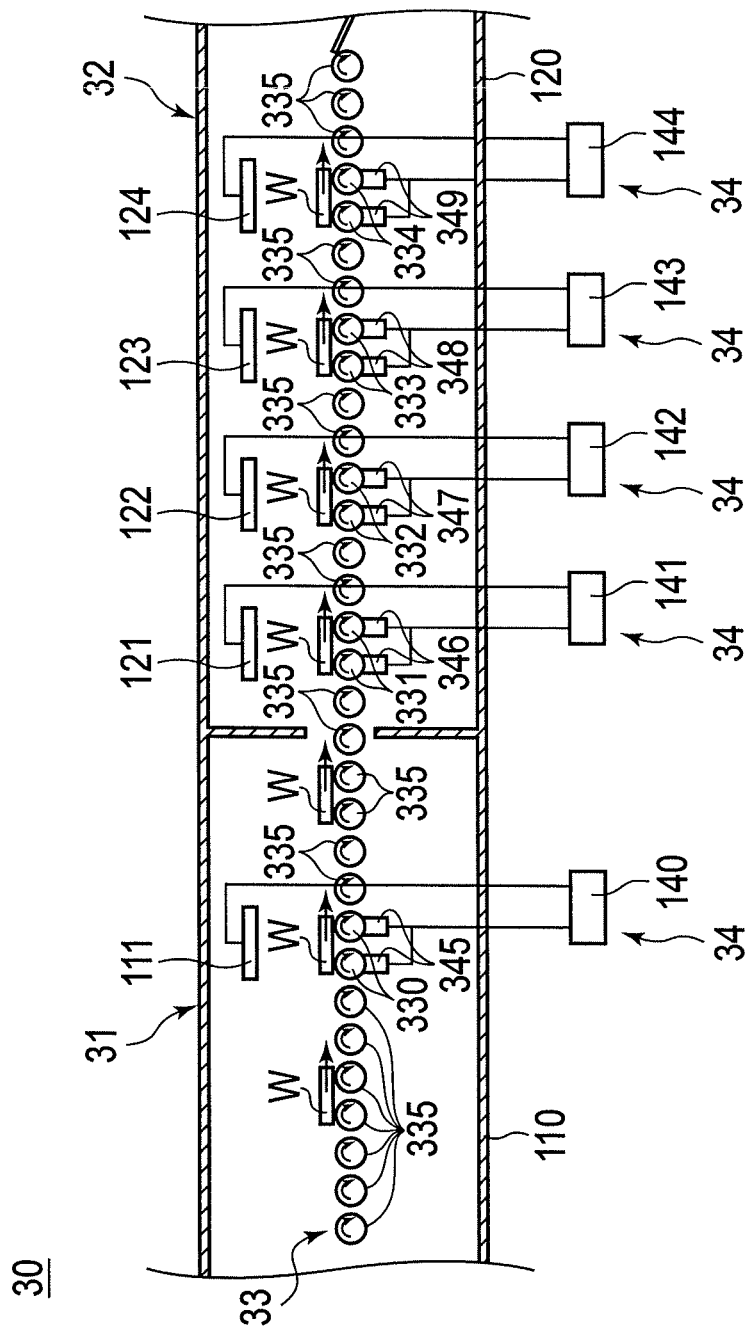
FIG. 4 is a side view illustrating a schematic configuration of an in-line coating device of a third embodiment.

As illustrated in FIG. 4, an in-line coating device 30 of a third embodiment includes a roller conveyor 33 that includes rotating rollers to transport workpieces W as the transport section instead of the belt conveyor 13 of the first embodiment. The other components of the third embodiment are the substantially same as those of the first embodiment. The same components as those of the first embodiment are given the same reference numerals in FIG. 4, and overlapping description is omitted.

The roller conveyor 33 includes conductive rollers 330, 331, 332, 333, and 334 (conducting portions). The rollers 330 to 334 are made of metal, for example. The rollers 330 face the electrode 111. The rollers 331 face the target 121; the rollers 332 face the target 122; the rollers 333 face the target 123; and the rollers 334 face the target 124.

The roller conveyor 33 includes insulating rollers 335. The rollers 335 are made of resin, for example. Some of the rollers 335 are arranged upstream of the rollers 330 in the transport direction of the workpieces W. Some of the rollers 335 are arranged between rollers 330 and rollers 331; some are arranged between the rollers 331 and rollers 332; some are arranged between the rollers 332 and rollers 333; and some are arranged between the rollers 333 and 334. The other rollers 335 are arranged downstream of the rollers 334 in the transport direction of the workpieces W. The rollers 330 to 335 are rotated by a motor.

The voltage applying section 34 of the third embodiment includes: brushes 345 configured to come into sliding contact with the rollers 330; brushes 346 configured to come into sliding contact with the rollers 331; brushes 347 configured to come into contact with the rollers 332; brushes 348 configured to come into contact with the rollers 333; and brushes 349 configured to come into contact with the rollers 334.

When a workpiece W is transported and reaches the rollers 330 and faces the electrode 111, the workpiece W is subjected to bombardment. The workpiece W comes into contact with the rollers 330 to be electrically connected to the rollers 330. The bias voltage is thereby applied to the workpiece W through the rollers 330. When the workpiece W moves apart from the rollers 330 to the rollers 335, the electrical connection between the workpiece W and power supply 140 is disconnected, and the bombardment is thereby stopped.

When the workpiece W is transported and reaches the rollers 331 and faces the target 121, the workpiece W is subjected to coating. The workpiece W comes into contact with the rollers 331 to be electrically connected to the rollers 331. The bias voltage is applied to the workpiece W through the rollers 331. When the workpiece W moves apart from the rollers 331 to the subsequent rollers 335, the electrical connection between the workpiece W and power supply 141 is disconnected, and the coating of the workpiece W is thereby stopped.

When the workpiece W is transported and reaches the rollers 332 and faces the target 122, the workpiece W is subjected to coating. The workpiece W comes into contact with the rollers 332 to be electrically connected to the rollers 332. The bias voltage is applied to the workpiece W through the rollers 332. When the workpiece W moves apart from the rollers 332 to the subsequent rollers 335, the electrical connection between the workpiece W and power supply 142 is disconnected, and the coating of the workpiece W is thereby stopped.

When the workpiece W is transported and reaches the rollers 333 and faces the target 123, the workpiece W is subjected to coating. The workpiece W comes into contact with the rollers 333 to be electrically connected to the rollers 333. The bias voltage is applied to the workpiece W through the rollers 333. When the workpiece W moves apart from the rollers 333 to the subsequent rollers 335, the electrical connection between the workpiece W and power supply 143 is disconnected, and the coating of the workpiece W is thereby stopped.

When the workpiece W is transported reaches the rollers 334 and faces the target 124, the workpiece W is subjected to coating. The workpiece W comes into contact with the rollers 334 to be electrically connected to the rollers 334. The bias voltage is applied to the workpiece W through the rollers 334. When the workpiece W moves apart from the rollers 334 to the subsequent rollers 335, the electrical connection between the workpiece W and power supply 144 is disconnected, and the coating of the workpiece W is thereby stopped.

The third embodiment is different from the first embodiment in that the roller conveyor 33 transports the workpieces W, but the roller conveyor 33 functions in a similar manner to the belt conveyor 13 of the first embodiment. Accordingly, the in-line coating device 30 and in-line coating method of the third embodiment exhibit the same effects as those of the first embodiment.

Fourth Embodiment

Figure 5:
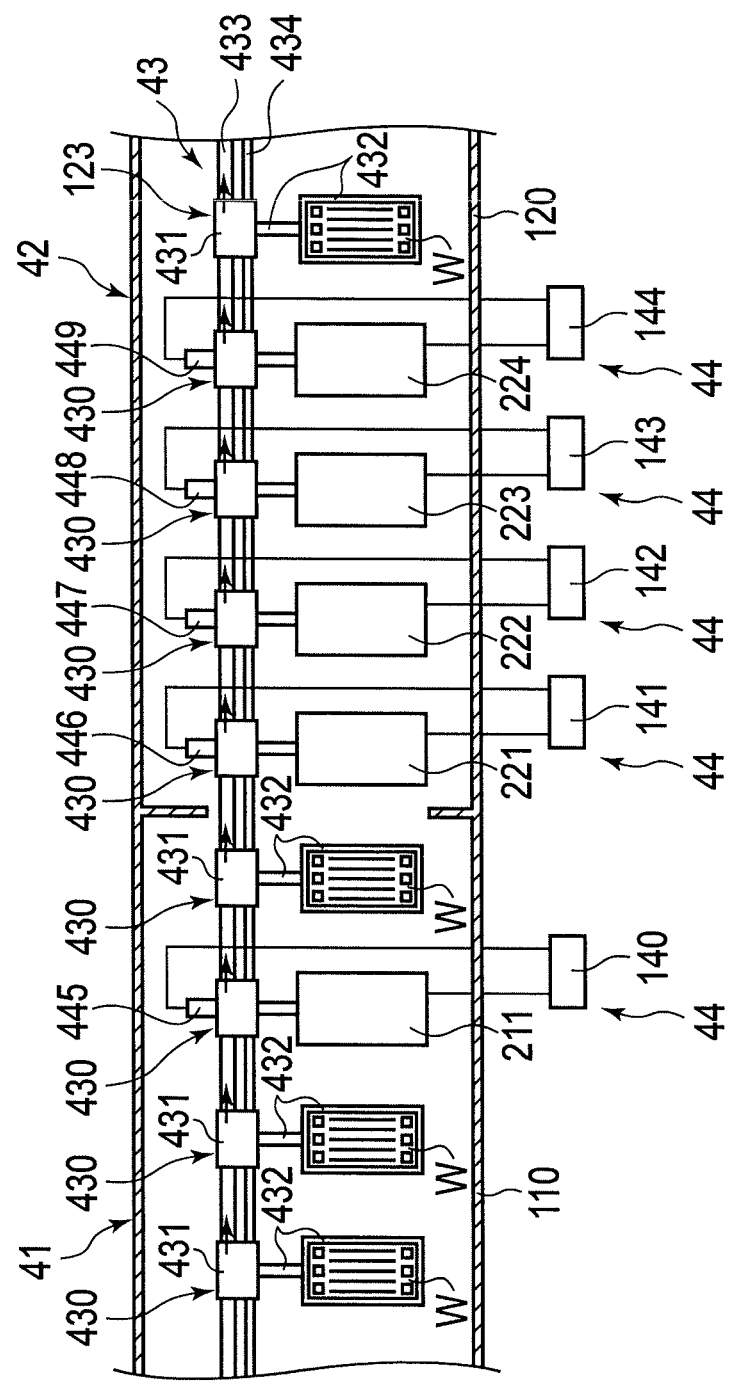
FIG. 5 is a side view illustrating a schematic configuration of an in-line coating device of a fourth embodiment.

As illustrated in FIG. 5, an in-line coating device 40 of a fourth embodiment includes a chain conveyor 43 configured to transport the workpieces W which are hanging as the transport section instead of the belt conveyor 13 of the second embodiment. The other components of the fourth embodiment are the substantially same as those of the second embodiment. The same components as those of the second embodiment are given the same reference numerals in FIG. 5, and overlapping description is omitted.

The chain conveyor 43 includes: a rail 433; supporting members (conducting portions) 430 supporting the workpieces W such that the workpieces W can move relative to the rail 433; and a chain 434 connected to the supporting members 430. The supporting members 430 are isolated from the chain 434. The chain 434 links the supporting members 430 to one another. The chain 434 is pulled to move the supporting members 430 along the rail 433 and transport the workpieces W. The driving source to pull the chain 434 is a motor, for example.

Each of the supporting members 430 includes a rail attachment 431 movably attached to the rail 433; and a hanging portion 432 which is connected to the rail attachment 431 and on which a workpiece W is hung. The rail attachment 431 is configured to be hooked on the rail 433 and includes wheels rolling along the rail 433, for example. The hanging portion 432 has a frame shape that fits on the edge of the workpiece W. The supporting member 430 is conductive. The supporting member 430 is electrically connected to the workpiece W.

The voltage applying section 44 of the fourth embodiment includes brushes 445, 446, 447, 448, and 449 which come into sliding contact with each supporting member 430. The power supply 140 is electrically connected to the brush 445. The power supply 140 is electrically connected to the electrodes 211. The power supply 141 is electrically connected to the brush 446. The power supply 141 is electrically connected to the targets 221. The power supply 142 is electrically connected to the brush 447. The power supply 142 is electrically connected to the targets 222. The power supply 143 is electrically connected to the brush 448. The power supply 143 is electrically connected to the targets 223. The power supply 144 is electrically connected to the brush 449. The power supply 144 is electrically connected to the targets 224.

When each supporting member 430 moves along the rail 433 to come into contact with the brush 445 and the workpiece W faces the electrodes 211, the workpiece W is subjected to bombardment. Since the electrodes 211 are placed so as to face the both surfaces of the workpiece W, the both surfaces of the workpiece W are bombarded. When coming into contact with the brush 445, the supporting member 430 is electrically connected to the brush 445. The bias voltage is applied to the workpiece W through the supporting member 430. When the supporting member 430 moves apart from the brush 445, the electrical connection between the workpiece W and power supply 140 is disconnected between the supporting members 430, and the bombardment is thereby stopped.

When the supporting member 430 moves along the rail 433 to come into contact with the brush 446 and the workpiece W faces the electrodes 211, the workpiece W is subjected to coating. Since the targets 211 are placed so as to face the both surfaces of the workpiece W, the both surfaces of the workpiece W are coated. When coming into contact with the brush 446, the supporting member 430 is electrically connected to the brush 446. When the supporting member 430 moves apart from the brush 446, the electrical connection between the workpiece W and power supply 140 is disconnected between the supporting members 430, and the coating is thereby stopped.

When the supporting member 430 moves to come into contact with the brush 447 and the workpiece W faces the targets 222, the both surfaces of the workpiece W are subjected to coating. When the supporting member 430 moves apart from the brush 447, the coating is stopped.

When the supporting member 430 moves to come into contact with the brush 448 and the workpiece W faces the targets 223, the both surfaces of the workpiece W are subjected to coating. When the supporting member 430 moves apart from the brush 448, the coating is stopped.

When the supporting member 430 moves to come into contact with the brush 449 and the workpiece W faces the targets 224, the both surfaces of the workpiece W are subjected to coating. When the supporting member 430 moves apart from the brush 449, the coating is stopped.

The fourth embodiment is different from the second embodiment in that the chain conveyor 43 transports the workpieces W that are hanging. However, the chain conveyor 43 functions in a similar manner to the belt conveyor 13 and jigs 23 of the second embodiment. Accordingly, the in-line coating device 40 and in-line coating method of the fourth embodiment exhibit the same effects as those of the second embodiment.

Fifth Embodiment

Figure 6:
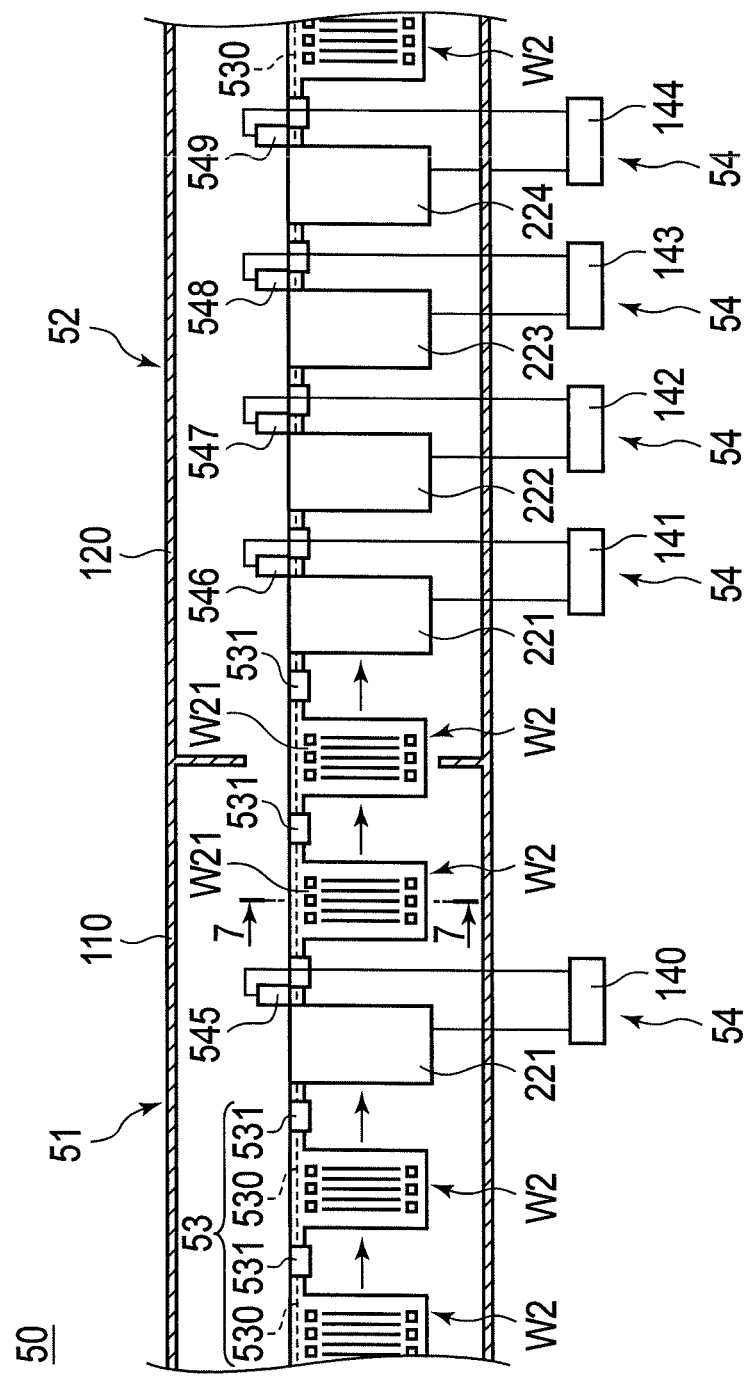
FIG. 6 is a view illustrating a schematic configuration of an in-line coating device of a fifth embodiment.

As schematically described in FIG. 6, an in-line coating device 50 of a fifth embodiment transports hanging workpieces W2 while coating the same in a similar manner to the fourth embodiment but is different from that of the fourth embodiment in terms of the shape of the workpieces W2 and the configuration of the transport section to transport the workpieces W2. The same components as those of the fourth embodiment are given the same reference numerals in FIG. 6.

The transport section includes a linear member 53 extending in the transport direction of the workpieces W2. The linear member 53 is pulled by a driving device including a motor and the like, for example, to move in the longitudinal direction. The workpieces W2 move together with the liner member 53. The linear member 53 includes cables 530 on which the workpieces W2 are hung; and insulators 531 provided between the cables 530. The workpieces W2 adjacent to each other are isolated by each insulator 531.

Figure 7:
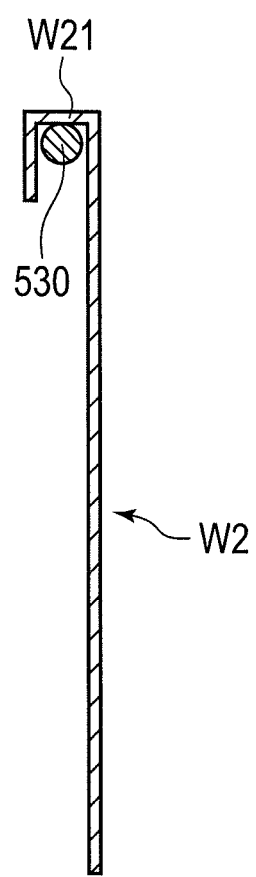
FIG. 7 is a cross-sectional view taken along a line 7-7 of FIG. 6.

As illustrated in FIG. 7, the workpieces W2 are different from the workpieces W of the other embodiments in that each workpiece W2 has a bent portion W21 (a hook portion), which is formed by bending an end of the workpiece W2. The workpiece W2 is hung with the bent portion W21 hooked on the cable 530. The bent portions W21 cover the cables 530 so that the cables 530 are not exposed to the targets 221 to 224.

As illustrated in FIG. 6, the voltage applying section 54 of the fifth embodiment includes brushes 545, 546, 547, 548, and 549 each of which alternately comes into sliding contact with the insulators 531 and bent portions W21. The electrodes 211, targets 221 to 224, power supplies 140 to 144 are the same as those of the fourth embodiment.

The brushes 545 is electrically connected to the power supply 140, respectively. The brushes 546 is electrically connected to the power supply 141, respectively. The brushes 547 is electrically connected to the power supply 142, respectively. The brushes 548 is electrically connected to the power supply 143, respectively. The brushes 549 is electrically connected to the power supply 144, respectively.

When a workpiece W2 is transported and the bent portion W21 thereof comes into contact with the brush 545, the electrodes 211 face the workpiece W2, and the brush 545 is electrically connected to the workpiece W2 to apply the bias voltage to the workpiece W2.

When the workpiece W2 is transported and the bent portion W21 thereof comes into contact with the brush 546, the targets 221 face the workpiece W2, and the brush 546 is electrically connected to the workpiece W2 to apply the bias voltage to the workpiece W2.

When the workpiece W2 is transported and the bent portion W21 thereof comes into contact with the brush 547, the targets 222 face the workpiece W2, and the brush 547 is electrically connected to the workpiece W2 to apply the bias voltage to the workpiece W2.

When the workpiece W2 is transported and the bent portion W21 thereof comes into contact with the brush 548, the targets 223 face the workpiece W2, and the brush 548 is electrically connected to the workpiece W2 to apply the bias voltage to the workpiece W2.

When the workpiece W2 is transported and the bent portion W21 thereof comes into contact with the brush 549, the targets 224 face the workpiece W2, and the brush 549 is electrically connected to the workpiece W2 to apply the bias voltage to the workpiece W2.

When each workpiece W2 faces the electrodes 211 and faces the targets 221 to 224, different bias voltages are applied to the workpiece W2. The both surfaces of the workpiece W2 are simultaneously bombarded when the workpiece W2 faces the electrodes 211. The both surfaces of the workpiece W2 are simultaneously coated when the workpiece W2 faces each pair of the targets 221 to 224.

Figure 8:
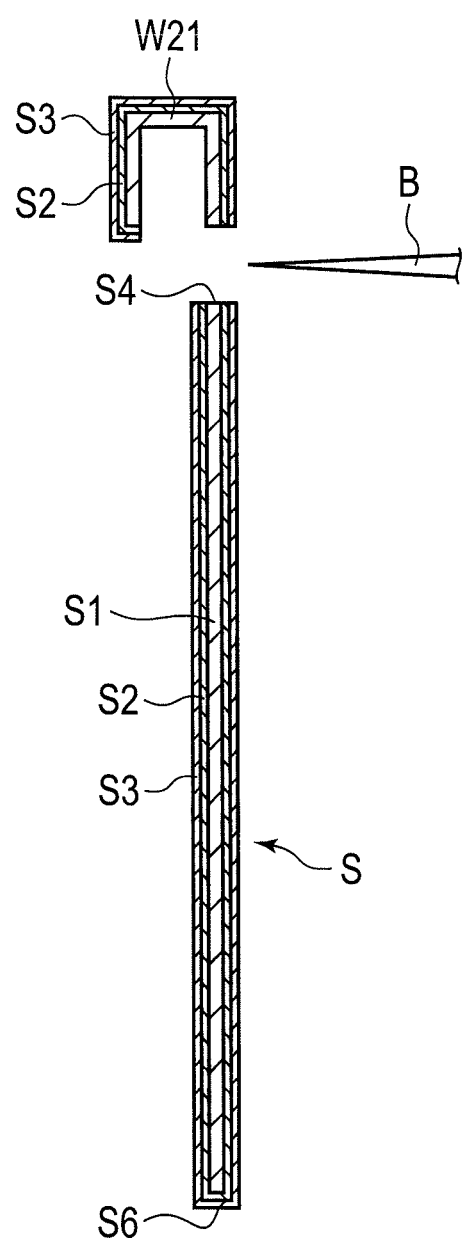
FIG. 8 is a view schematically illustrating cutting of an end of a base material in the process of forming a separator.

As illustrated in FIG. 8, the bent portion W21 is unnecessary after coating and is removed, thus forming a separator S used in polymer electrolyte fuel cells. The bent portion W21 is removed by cutting using a blade B or a laser beam, for example.

The separator S includes: a base material S1 as the workpiece W2; and coating layers S2 and S3 formed on the surface of the base material S1.

Examples of the material constituting the coating layers S1 are iron, titanium, aluminum, and alloys thereof, for example. The iron alloys include stainless.

The coating layer S2 is formed when the workpiece W2 passes between the targets 221 and then passes between the targets 222. The coating layer S2 includes a double-layer structure in which the layer formed when the workpiece W2 passes between the targets 222 is laid on the layer formed when the workpiece W2 passes between the targets 221. The properties of the two layers can be individually changed by changing the bias voltages.

Examples of the material constituting the coating layer S2 are chrome (Cr), tungsten (W), titanium (Ti), molybdenum (Mo), niobium (Nb), and hafnium (Hf), nitrides thereof, carbides thereof, and carbonitrides thereof. The material constituting the coating layer S2 is not limited to these materials. The material constituting the coating layer S2 can be changed by changing the materials constituting the targets 221 and 222.

The coating layer S3 is formed when the workpiece W2 passes between the targets 223 and passes between the targets 224. The coating layer S3 includes a double-layer structure in which the layer formed when the workpiece W2 passes between the targets 223 is laid on the layer formed when the workpiece W2 passes between the targets 224. The properties of the two layers, such as conductivity or hardness, for example, can be individually changed by changing the bias voltages.

The coating layer S3 is made of diamond-like carbon (DLC), for example, but is not limited to DLC. The material constituting the coating layer S3 can be changed by changing the materials constituting the targets 223 and 224.

Figure 9:
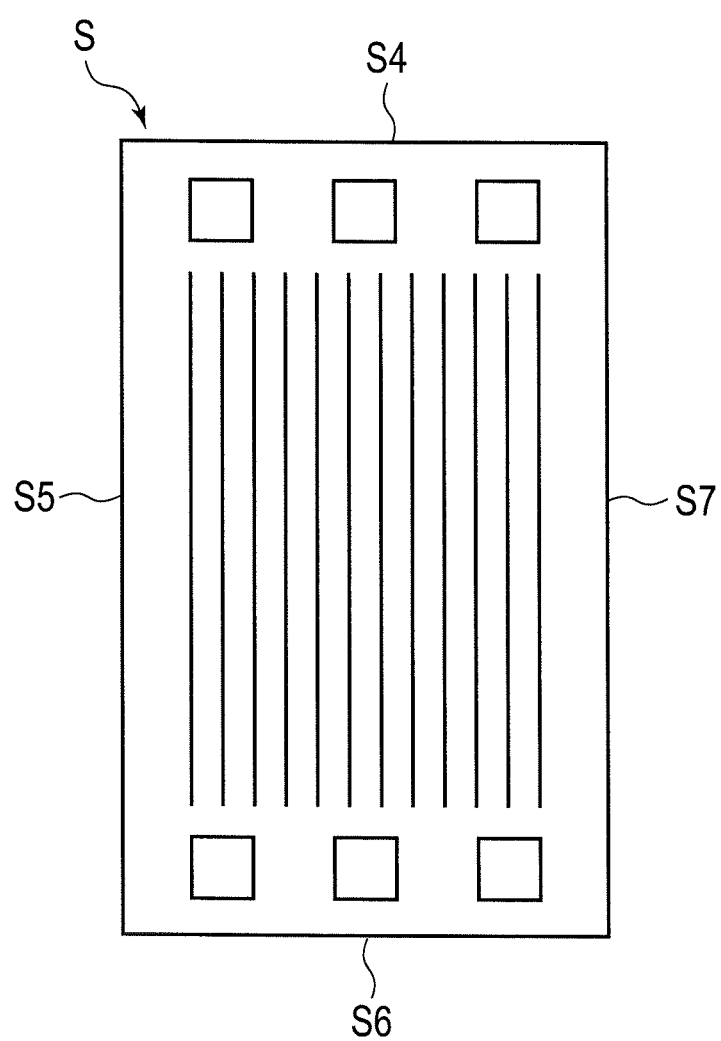
FIG. 9 is a plan view schematically illustrating the formed separator.

The base material S1 and separator S have a rectangular shape in a plan view illustrated in FIG. 9. An end face S4 constituting one side in the periphery of the rectangular shape has a different characteristic from that of the end faces S5, S6, and S7.

As illustrated in FIGS. 8 and 9, the end face S4 is a cut surface formed by cutting the bent portion W21 as an end of the base material S1 unlike the end faces S5 to S7. On the other hand, the coating materials adhere to the end faces S5 to S7 of the base material S1 during the process of coating. The proportion of an area in the end face S4 as cut surface, to which the coating materials do not adhere, that is, to which the substrate S1 is exposed is higher than those of the end faces S5 to S7.

The configuration in which the end face S4 has a different characteristic from that of the end faces S5 to S7 constituting the other sides is not limited to the above-described configuration in which the end face S4 is different from the end faces S5 to S7 in terms of the proportion of the area to which the base material S1 is exposed. The configuration includes the configuration in which the end face S4 is not linear and has a different shape from that of the other end faces S5 to S7 in the plan view illustrated in FIG. 9, for example.

In the fifth embodiment, the workpieces W2 cover the cables 530 that face the targets 221 to 224 when the bias voltages are applied to the workpieces W2. This can prevent the coating materials from adhering to the transport section and therefore reduce the efforts of maintenance to remove the unnecessary coating materials adhering to the transport section by blasting or the like. Accordingly, the fifth embodiment exhibits the effect on further improving the mass production in addition to the effects of the fourth embodiment. The insulators 531 do not face the targets 221 to 224 when the bias voltage is applied to the workpiece W2, and the coating materials are not deposited on the insulators 531.

Since the coating materials are prevented from adhering to the transport section, the coating materials are also prevented from peeling off and adhering to the workpieces W2 as foreign matters. This can improve the percentage of non-defective products.

Since the bent portions W21 are hooked on the cables 530, it is possible to apply appropriate bias voltages corresponding to the targets 221 to 224 to the transported workpieces W2 through the bent portions W21.

Since the workpieces W2 are hooked on the cables 530 for transportation, the transport section does not need to include jigs to hang the workpieces W2, thus simplifying the configuration of the transport section. Moreover, there is no need for the trouble of setting the workpieces W2 to jigs to hang the workpieces W2, thus facilitating the operation.

Sixth Embodiment

Figure 10:
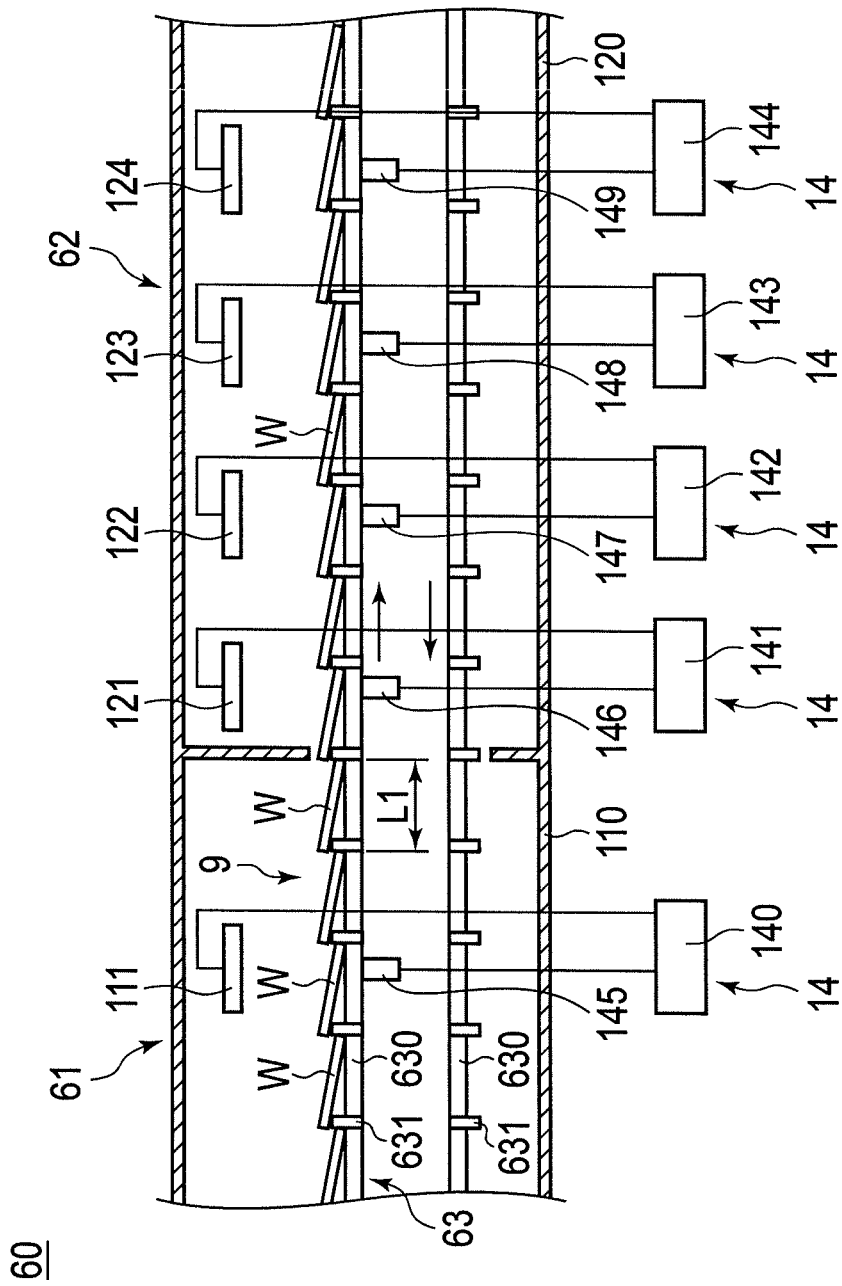
FIG. 10 is a view illustrating a schematic configuration of an in-line coating device of the sixth embodiment.

As schematically described in FIG. 10, an in-line coating device 60 of a sixth embodiment is different from that of the first embodiment in terms of the configuration of a belt conveyor 63 as the transport section and the position of each workpiece W on the belt conveyor 63. The other components of the sixth embodiment are the substantially same as those of the first embodiment. The same components in FIG. 10 as those of the first embodiment are given the same reference numerals.

The belt conveyor 63 includes conducting portions 630 and insulators 631 which are alternately arranged in the transport direction. The conducting portions 630 and insulators 631 constitute a belt. The conducting portions 630 are made of metal, for example. The insulators 631 are made of resin, for example. The conducting portions 630 have a flat plate shape. The insulators 631 protrude in the thickness direction of the conducting portions 630. The conducting portions 630 adjacent to each other are isolated by each insulator 631.

Each workpiece W is arranged at an angle between adjacent ones of the insulators 631, which are spaced from one another in the transport direction, such that an end of the workpiece W abuts on a side of one of the adjacent insulators 631 and the other end is arranged on the other insulator 631. The workpieces W adjacent to each other are isolated by each insulator 631. The workpieces W are in contact with the conducting portions 630 and are electrically connected to the conducting portions 630.

When each conducting portion 630 moves and comes into contact with the brush 145, the bias voltage is applied to the workpiece W from the power supply 140 through the conducting portion 630, and the workpiece W is subjected to bombardment. When the conducting portion 630 moves and comes into contact with the brush 146, the bias voltage is applied to the workpiece W from the power supply 141 through the conducting portion 630, and the workpiece W is subjected to coating. When the conducting portion 630 moves and comes into contact with the brush 147, the bias voltage is applied to the workpiece W from the power supply 142 through the conducting portion 630, and the workpiece W is subjected to coating. When the conducting portion 630 moves and comes into contact with the brush 148, the bias voltage is applied to the workpiece W from the power supply 143 through the conducting portion 630, and the workpiece W is subjected to coating. When the conducting portion 630 moves and comes into contact with the brush 149, the bias voltage is applied to the workpiece W from the power supply 144 through the conducting portion 630, and the workpiece W is subjected to coating.

Figure 11:
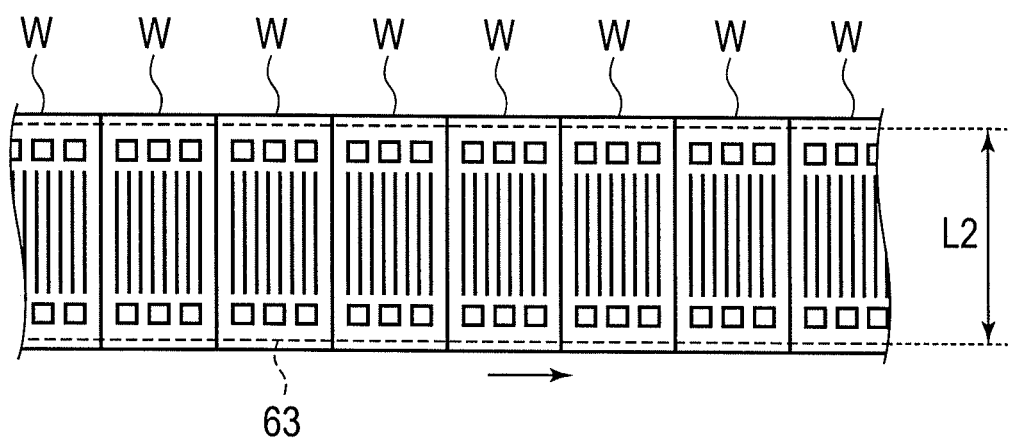
FIG. 11 is a view indicated by an arrow of reference numeral 9 in FIG. 10.

The workpieces W cover the conducting portions 630 and insulators 631. The size in the transport direction, of the projection of each workpiece W projected in the direction orthogonal to the surface of the belt is substantially equal to a width L1 of the adjacent conducting portion 630 and insulator 631 in the transport direction. As illustrated in FIG. 11, moreover, the size of the workpiece W in the direction which is orthogonal to the transport direction and parallel to the surface of the belt is equal to or more than a width L2 of the belt.

In such a manner, in the sixth embodiment, the workpieces W cover the entire upper surface of the belt that faces the targets 121 to 124. The coating materials are therefore prevented from adhering to the belt conveyor 63 in the process of coating. According to the sixth embodiment, similarly to the fifth embodiment, the device can be easily maintained, and the percentage of non-defective products is improved.

The present invention is not limited to the aforementioned embodiments and can be variously modified within the scope of claims.

In the above-described embodiments, for example, the workpieces are coated by sputtering but are not limited to this case. The workpieces may be coated by another process of coating by applying bias voltage to the workpieces, such as ion plating, for example. In the case of ion plating, vapor sources which are heated using electron beams and the like to evaporate the coating materials and emit gas particles are used instead of the targets 121 to 124 and 221 and 224 of the above-described embodiments.

In the oxide film removing section, it is only necessary to remove the oxide film on the surface of each workpiece by bombardment. The oxide film removing section may include an ion gun emitting accelerated ions toward the workpieces instead of the electrodes 111 and 211 of the aforementioned embodiments.

This application is based upon Japanese Patent Application No. 2012-219459 filed on Oct. 1, 2012 and Japanese Patent Application No. 2013-140834 filed on Jul. 4, 2013, the entire disclosures of which are incorporated herein by reference.

REFERENCE SIGNS LIST 10, 20, 30, 40, 50, 60 IN-LINE COATING DEVICE
11, 21, 31, 41, 51, 61 OXIDE FILM REMOVING SECTION
12, 22, 32, 42, 52, 62 COATING SECTION
13 BELT CONVEYOR (TRANSPORT SECTION)
14, 34, 44 VOLTAGE APPLYING SECTION
33 ROLLER CONVEYOR (TRANSPORT SECTION)
43 CHAIN CONVEYOR (TRANSPORT SECTION)

53 LINEAR MEMBER
111 ELECTRODE
121, 122, 123, 124 TARGET (COATING MATERIAL)
130 CONDUCTING PORTION
211 ELECTRODE
221, 222, 223, 224 TARGET (COATING MATERIAL)
330, 331, 332, 333, 334 ROLLER
430 SUPPORTING MEMBER
530 CABLE
531 INSULATOR
630 CONDUCTING PORTION
631 INSULATOR
B BLADE
W, W2 WORKPIECE
W21 BENT PORTION (HOOK PORTION)
S SEPARATOR
S1 BASE MATERIAL
S2 COATING LAYER
S3 COATING LAYER
S4 END FACE (CUT SURFACE)
S5 END FACE
S6 END FACE
S7 END FACE

The invention claimed is:

1. An in-line coating device, comprising:
a transport section configured to transport a workpiece which is a separator for a fuel cell, the transport section continuously extending in a transport direction of the workpiece;
a coating section having a source of coating material arranged in the transport direction so as to face the workpiece;
an oxide film removing section provided upstream of the coating section in the transport direction and configured to remove oxide film on the workpiece by bombardment; and
a voltage applying section configured to, when the workpiece is transported and faces the source of coating material, apply to the workpiece, a bias voltage to attract particles emitted from the source of coating material toward the workpiece, wherein
the workpiece is continuously coated with the coating material in the coating section,
the bias voltage applied to the workpiece by the voltage applying section when the workpiece faces the source of coating material can be different from that applied when the workpiece faces another source of another coating material in the coating section, and
wherein
a surface of the source of coating material is parallel or substantially parallel to the transport direction,
a surface of the workpiece is parallel or substantially parallel to the transport direction,
a surface of the transport section of the in-line coating device faces the workpiece when the bias voltage is applied to the workpiece, and
when the workpiece faces the source of coating material,
the surface of the source of coating material is parallel or substantially parallel to the surface of the workpiece, and
the entire transport section of the in-line coating device has an entire width in a width direction, the width direction being a single direction perpendicular to the transport direction and parallel or substantially parallel to the surface of the source of coating material, and the entire width of the entire transport section of the in-line coating device is covered by the surface of the workpiece facing the source of coating material from the point of view of the source of coating material.

2. The in-line coating device according to claim 1, wherein
a bias voltage applied to the workpiece at the oxide film removing section is different from the bias voltage applied to the workpiece at the coating section.

3. The in-line coating device according to claim 1, wherein
the application of the bias voltage to the workpiece and the stop thereof are switched by electrical connection of the workpiece and the voltage applying section and by disconnection of the electrical connection of the workpiece and the voltage applying section, the connection and disconnection being implemented as the workpiece is transported.

4. The in-line coating device according to claim 1, wherein
the transport section of the in-line coating device includes a linear member extending in the transport direction,
the workpiece is transported with a part thereof hooked on the linear member, and
a hook portion of the workpiece that is hooked on the linear member covers the surface of the transport section of the in-line coating device that faces the workpiece when the bias voltage is applied to the workpiece.

5. The in-line coating device according to claim 1, wherein the source of coating material is arranged on both sides of the workpiece in a direction that intersects the transport direction.

6. An in-line coating device, comprising:
a transport section configured to transport a workpiece which is a separator for a fuel cell, the transport section continuously extending in a transport direction of the workpiece;
a coating section having sources of coating materials arranged in the transport direction so as to face the workpiece; and
a voltage applying section configured to apply, to the workpiece, bias voltages to attract particles emitted from the sources of coating materials toward the workpiece when the workpiece transported by the transport section faces one of the sources of coating materials of the coating section, wherein
the coating section continuously coats the workpiece with coating materials,
the bias voltage applied to the workpiece by the voltage applying section when the workpiece faces one of the sources of coating materials is different from that applied when the workpiece faces another one of the sources of coating materials, and
wherein
a surface of each of the sources of coating materials is parallel or substantially parallel to the transport direction,
a surface of the workpiece is parallel or substantially parallel to the transport direction,
a surface of the transport section of the in-line coating device faces the workpiece when the bias voltage is applied to the workpiece, and
when the workpiece faces the one of the sources of coating materials,
the surface of the one of the sources of coating materials is parallel or substantially parallel to the surface of the workpiece, and the entire transport section of the in-line coating device has an entire width in a width direction, the width direction being a single direction perpendicular to the transport direction and parallel or substantially parallel to the surface of the source of coating material, and the entire width of the entire transport section of the in-line coating device is covered by the surface of the workpiece facing the one of the sources of coating materials from the point of view of the one of the sources of coating materials.

7. The in-line coating device according to claim 6, further comprising an oxide film removing section provided upstream of the coating section in the transport direction.

8. The in-line coating device according to claim 7, wherein the oxide film removing section is configured to remove oxide film on the workpiece by bombardment.

* * * * *